(12) United States Patent
Itoh et al.

(10) Patent No.: US 6,204,511 B1
(45) Date of Patent: Mar. 20, 2001

(54) ELECTRON BEAM IMAGE PICTURING METHOD AND IMAGE PICTURING DEVICE

(75) Inventors: Masamitsu Itoh; Shunko Magoshi, both of Yokohama; Shinji Sato, Kawasaki, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/192,311

(22) Filed: Nov. 16, 1998

(30) Foreign Application Priority Data

Nov. 17, 1997 (JP) .................................................. 9-315171

(51) Int. Cl.$^7$ ............................. H01J 37/30; H01J 37/302
(52) U.S. Cl. ...................................... 250/492.22; 250/398
(58) Field of Search .......................... 250/492.22, 492.2, 250/398

(56) References Cited

U.S. PATENT DOCUMENTS

| | | | | |
|---|---|---|---|---|
| 4,728,797 | * | 3/1988 | Gotou et al. | 250/492.22 |
| 5,657,235 | * | 8/1997 | Liebmann et al. | 250/492.22 |
| 5,698,859 | * | 12/1997 | Haruki | 250/492.22 |
| 5,740,068 | * | 4/1998 | Liebmann et al. | 250/492.22 |

FOREIGN PATENT DOCUMENTS 6-267833   9/1994   (JP) .

OTHER PUBLICATIONS

M. Itoh et al., "Line–width controllability depending on electron–beam blur and resist thickness", Proceedings of SPIE, vol. 3331—48, (1998).

* cited by examiner

*Primary Examiner*—Bruce C. Anderson
(74) *Attorney, Agent, or Firm*—Finnegan, Henderson, Farabow, Garrett & Dunner, L.L.P.

(57) ABSTRACT

In the electron beam drawing method, the optimal irradiation amount of an electron beam in accordance with a drawing area ratio at each of drawing positions, is obtained prior to drawing a desired pattern by irradiating an electron beam on a sample. The optimal irradiation amount obtained is separated in a plurality of gradations as a correction amount for a reference irradiation amount of the electron beam. This separation is made finer as the drawing area ratio is higher. The representative correction amount data is determined for each of the plurality of gradations. The representative correction amount data determined is stored for each of the plurality of gradations, and a pattern is drawn on a sample with the optical irradiation amount corresponding to read data of the representative correction amount stored.

12 Claims, 3 Drawing Sheets

ELECTRON BEAM IMAGE PICTURING METHOD AND IMAGE PICTURING DEVICE

BACKGROUND OF THE INVENTION

The present invention relates to an image picturing method and an image picturing device, which use an electron beam, and more specifically, to an electron beam image picturing method and image picturing device, which are effective for the correction of the proximity effect.

In the drawing of an image using an electron beam, the phenomenon called back scattering occurs, in which electron made incident on a substrate on which an image is to be written, scatters within the substrate and appears once again on the surface of the substrate. The range in which back scattering reaches (that is, the diameter of the back scattering) is dependent on the energy of incident electron and the material of the substrate.

As the incident energy becomes larger, the diameter of the back scattering becomes larger, and as the atomic number of the material of the substrate is larger, it becomes smaller. The ratio of the energy of the back scattering with respect to the incident energy is called back scattering coefficient, and the back scattering coefficient becomes larger as the atomic number of the material of the substrate is larger. However, for substrates of the same material, the coefficient may differ from one another depending upon the type of the light sensitive agent (resist) applied thereon.

The energy accumulated in a resist is the total of the energy of the incident electron and that of the electron back-scattered. In the case of a pattern having a drawing area ratio, the pattern is greatly influenced by the back scattering, and as compared with a pattern having a small drawing area ratio, the energy accumulated in the resist becomes larger for the same incident energy. The drawing area ratio used here is the ratio of the area of the image drawn to the area of desired region in the surface of the substrate.

The phenomenon in which the effective irradiation amount differs when the drawing area ratio differs within the region where the back scattering reaches, is called proximity effect. As a result of the proximity effect, patterns drawn with the same irradiation amount, will have resist pattern sizes different from each other when the drawing area ratio differs from one another. As a solution to this, the correction of the irradiation amount in accordance with the image drawing area ratio (the correction of proximity effect) is generally carried out. The correction amount can be obtained by calculation from the data of the pattern to be drawn, and the correction amount is stored as the irradiation amount correction data together with the pattern drawing data.

The irradiation amount correction data is stored usually as data of 256 gradations. As the number of gradations is larger, it is possible to make the correction of a higher efficiency; however the data amount becomes larger. Conventionally, the correction to be carried on is divided to correspond to 256 gradations at a certain width, which is equivalent to 0.7% of the reference irradiation amount for one gradation. Therefore, the correction amount of 0% to less than 0.7% is for the first gradation, the correction amount of 0.7% to less than 1.4% is for the second gradation, and so on.

As a pattern has a higher image drawing area ratio, the ratio of the back scattering energy occupied in the energy accumulated in the resist becomes larger, thus the contrast of pattern becomes poor. Therefore, the variance in the size of the resist pattern, which occurs due to the variance of the irradiation amount, differs depending upon the pattern drawing area ratio.

FIG. 1 shows the relationship between the pattern drawing area ratio and the amount of the variance in line width of a pattern, obtained in the case where the irradiation amount varies by 1 $\mu C/cm^2$. In the case where the pattern drawing area ratio is close to 100%, when the irradiation amount varies by 1 $\mu C/cm^2$, the line width of the resist pattern varies by about 23 nm, whereas when the drawing area ratio is close to 0%, the variance of the measurement of the line width can be limited small as about 10 nm for the same irradiation variance amount.

In the meantime, the correction amount is not in the form of continuous data, but is divided into 256 gradations, as described above. Since there are such gradations, stepwise differences, although they are small, are created in the correction amount data. For example, in the case where the correction amount for one gradation is 0.7% of the reference irradiation amount, an error of ±0.35% may be created. When this is applied to the resist whose reference irradiation amount 20 $\mu C/cm^2$, the error in the irradiation amount is ±0.07 $\mu C/cm^2$. Since the irradiation amount error is constant regardless of the drawing area ratio, in a region where the drawing area ratio is close to 0%, the error in dimension is about 0.7 nm, whereas in a region where the drawing area ratio is close to 100%, the error in dimension is about 1.6 nm. Thus, for different drawing area ratios, different effective irradiation amounts result. Therefore, the proximity effect correction efficiency differs from one case to another.

Further, usually, the optimal irradiation amount obtained when the drawing area ratio is 100% is assigned as a reference irradiation amount, and the range from a drawing area ratio of 100% to 0% is separated into 256 gradations to carry out the correction. Therefore, naturally, even in the case where the drawing area ratio is placed between 0% and 50%, the range between a drawing area ratio of 0% and that of 100% is separated into 256 gradations. Accordingly, the correction accuracy becomes poor.

In the meantime, there is recently a high demand of increasing the accuracy of photomasks used in the lithography step of the manufacture of semiconductors. More specifically, there is a demand of achieving a dimension accuracy of 10 nm (3 σ) for a pattern on a photomask in the manufacture of a 0.13 $\mu m$-device. There are a number of factors which causes an error in the pattern dimension of a photomask, for example, the error in the form of beam used in the electron beam drawing device, the variance in the irradiation amount, and the variation in the sensitivity of the resist. Therefore, it is required that the error in dimension which is due to the proximity effect correction should be 3 nm or less at least. There are some factors for errors caused due to the proximity effect correction, that is, for example, the error in the calculation of the proximity effect correction and the error of the corrected gradations. Here, it is preferable that the error in dimension due to the error of the corrected gradations should be 1 nm or less. Thus, the conventional proximity effect correcting method entails a problem that the error in dimension exceeds an allowable limit in the region where the drawing area ratio is large.

BRIEF SUMMARY OF THE INVENTION

As described above, in the conventional electron beam pattern drawing method and device, the gradation is separated at a constant width regardless of that the variance amount of the pattern dimension differs as the drawing area ratio varies. As a result, the correction accuracy varies depending upon the drawing area ratio.

Further, even in the case where the drawing area ratio is placed within a certain limitation, the range between a drawing area ratio of 0% and that of 100% is separated into a preset number of gradations. Accordingly, the correction accuracy cannot be improved.

The present invention has been proposed so as to solve the drawbacks of the conventional technique, and the object thereof is to electron-beam pattern drawing method and device, capable of achieving a constant correction accuracy regardless of the drawing area ratio, and improving the correction accuracy itself.

In order to achieve the above described object, there is provided an electron beam drawing method comprising the steps of:

obtaining an optimal irradiation amount of an electron beam in accordance with a drawing area ratio at each of drawing positions, prior to drawing a pattern by irradiating an electron beam on a sample;

separating the optimal irradiation amount obtained in a plurality of gradations as a correction amount for a reference irradiation amount of the electron beam, the separation being made finer as the drawing area ratio being higher, and determining a representative correction amount data for each of the plurality of gradations;

storing the representative correction amount data determined for each of the plurality of gradations; and drawing a pattern on a sample with the optical irradiation amount corresponding to read data of the representative correction amount stored.

According to the present invention, there is further provided an electron beam drawing method comprising the steps of:

obtaining an optimal irradiation amount of an electron beam in accordance with a drawing area ratio at each of drawing positions, prior to drawing a desired pattern by irradiating an electron beam on a sample;

separating the optimal irradiation amount obtained in a plurality of gradations as a correction amount for a reference irradiation amount of the electron beam, the separation being made in a plurality of gradations between a maximum value of the correction amount and a minimum value of the correction amount, and determining a representative correction amount data for each of the plurality of gradations;

storing the representative correction amount data determined for each of the plurality of gradations; and drawing a pattern on a sample with the optical irradiation amount corresponding to read data of the representative correction amount stored.

There is further provided an electron beam drawing device comprising:

means for obtaining an optimal irradiation amount of an electron beam in accordance with a drawing area ratio at each of drawing positions, prior to drawing a desired pattern by irradiating an electron beam on a sample;

means for separating the optimal irradiation amount obtained in a plurality of gradations as a correction amount for a reference irradiation amount of the electron beam, the separation being made finer as the drawing area ratio is higher, and determining a representative correction amount data for each of the plurality of gradations;

means for storing the representative correction amount data determined for each of the plurality of gradations; and means for drawing a pattern on a sample with the optical irradiation amount corresponding to read data of the representative correction amount stored.

Furthermore, there is provided an electron beam drawing device comprising:

means for obtaining an optimal irradiation amount of an electron beam in accordance with a drawing area ratio at each of drawing positions, prior to drawing a desired pattern by irradiating an electron beam on a sample;

means for separating the optimal irradiation amount obtained in a plurality of gradations as a correction amount for a reference irradiation amount of the electron beam, the separation being made in a plurality of gradations between a maximum value of the correction amount and a minimum value of the correction amount, and determining a representative correction amount data for each of the plurality of gradations;

means for storing the representative correction amount data determined for each of the plurality of gradations; and means for drawing a pattern on a sample with the optical irradiation amount corresponding to read data of the representative correction amount stored.

With the structure described above, the electron beam drawing method and device according to the present invention, separates the correction amount in more fine gradations, as the drawing area ratio is higher. Therefore, it is possible to obtain a constant correction accuracy regardless of the drawing area ratio. Further, in the case where the drawing area ratio falls within a certain range, the section between the maximum value or a value closer to the maximum and the minimum value or a value closer to the minimum value can be separated in a predetermined number of gradations, thus making it possible to improve the correction accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
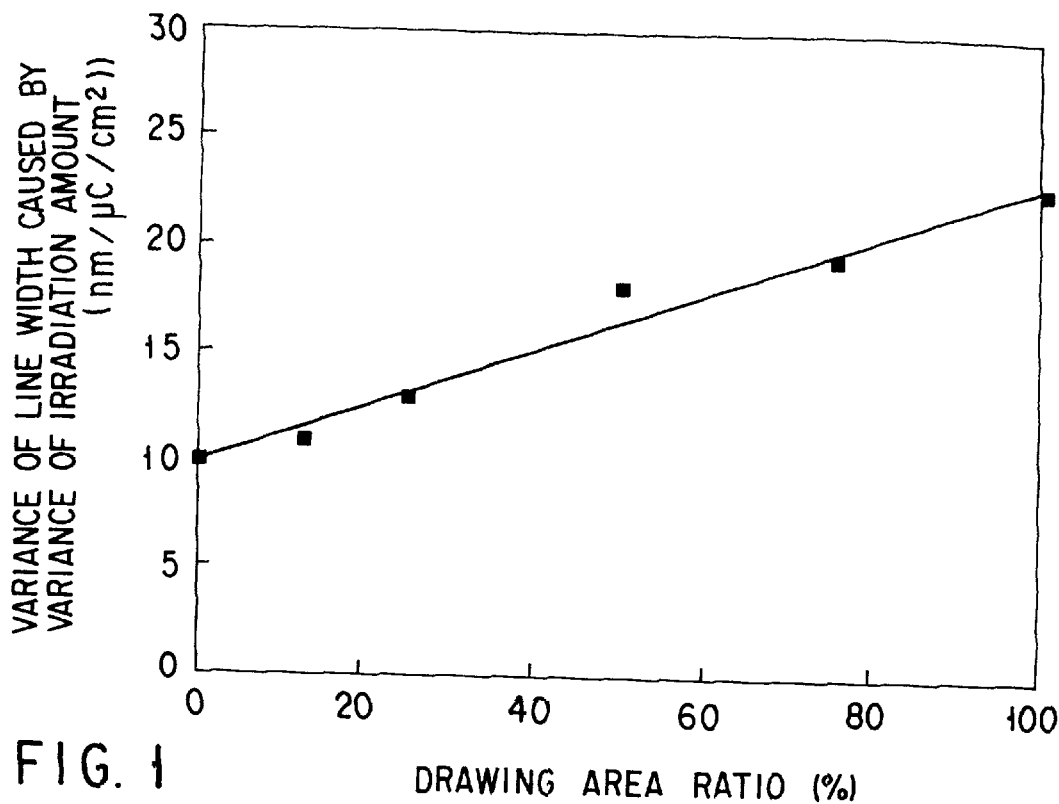
FIG. 1 is a diagram showing the relationship between the pattern drawing area ratio and the variance of the line width which changes due to the variance of the irradiation amount.

Embodiments of the present invention will now be described in detail with reference to accompanying drawings.

In the first embodiment of the present invention, the optimal irradiation amount is obtained in accordance with the drawing area ratio (the ratio of the area to be drawn with respect to the area of a predetermined region) at each of the pattern drawing positions, before a predetermined pattern is drawn by irradiating an electron beam onto a sample. The optimal irradiation amount which corresponds to the drawing area is assigned as the correction amount with respect to the reference irradiation amount, and is separated into a plurality of gradations. Then, the representative correction amount determined for each gradation is stored as data. In the drawing method of drawing a pattern on a sample with the optimal irradiation amount which corresponds to the data for the stored representative correction amount, the gradation separation is made finer as the drawing area ratio is higher.

Figure 2:
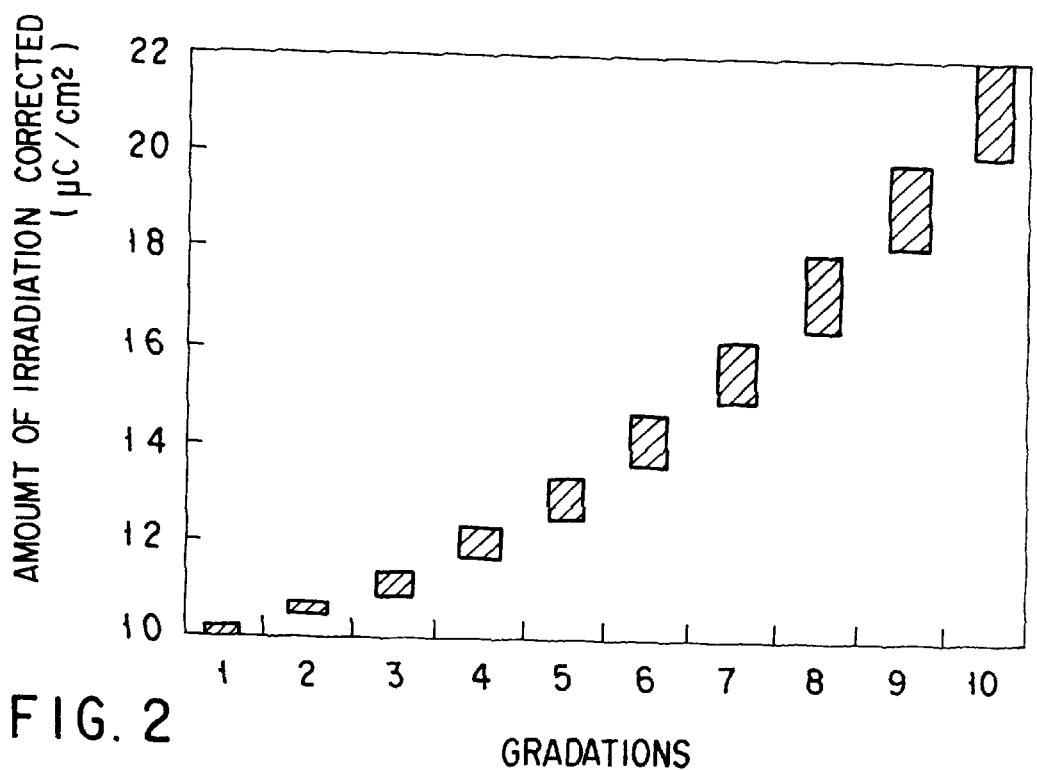
FIG. 2 is an explanatory diagram illustrating the separation of the gradation for explaining the electron beam drawing method of the present invention.

In order to make the description of the first embodiment easier to understand, the following explanation will be made in connection with the case where the number of gradations is 10 with reference to FIG. 2. This embodiment is directed to the case where the optimal irradiation amount for a drawing area ratio of 100% is assigned as the reference irradiation amount. As shown, as the drawing area ratio is higher and the influence of the back scattering is greater, that is, the correction irradiation amount is smaller, the separation for one gradation becomes finer.

As described before, as the drawing area ratio is higher, the variance amount of the dimension of pattern becomes larger. However, in the conventional technique, the gradation is separated by a constant width, and therefore the correction accuracy becomes poorer as the drawing area ratio is higher.

According to the first embodiment, the gradation separation is made finer as the drawing area ratio is higher, and therefore it becomes possible to obtain a constant correction accuracy regardless of the drawing area ratio.

In the second embodiment of the present invention, the optimal irradiation amount is obtained in accordance with the drawing area ratio at each of the pattern drawing positions, before a predetermined pattern is drawn by irradiating an electron beam onto a sample. The optimal irradiation amount which corresponds to the drawing area is assigned as the correction amount with respect to the reference irradiation amount, and is separated into a plurality of gradations. Then, the representative correction amount determined for each gradation is stored as data.

In the drawing method of drawing a pattern on a sample with the optimal irradiation amount which corresponds to the data for the stored representative correction amount, the correction amount taken between the maximum value or a value close to the maximum, and the minimum value or a value close to the minimum is separated into a plurality of gradations.

As described before, conventionally, even in the case where the drawing area ratio falls within a certain range, the section between a drawing area ratio of 0% and that of 100% is separated into a predetermined number of gradations. By contrast, according to the present invention, in the case where the drawing area ratio falls within a certain range, the section between the maximum value (or a value close to the maximum) and the minimum (or a value close to the minimum), can be separated into a preset number of gradations, and therefore the correction accuracy can be improved.

In the second embodiment, it is also possible that the gradation is separated finer as the drawing area ratio is higher, and in this case, the operational effect achieved in the first embodiment can be obtained as well.

In the first and second embodiments, the relationship between the optimal irradiation amount $D_k$ and the reference irradiation amount $D_0$ is assigned as:

$$D_k = M_k \times D_0$$

where k represents the gradation number of a gradation, $M_k$ represents the representative correction amount corresponding to the gradation number k, $D_k$ represents the optical irradiation amount obtained from the representative correction amount $M_k$.

Further, the variance dw of the line width of a pattern per a unit irradiation amount dD is expressed in the form of a linear expression (first order formula) of the drawing area ratio ρ, that is, $$dw/dD = A \times \rho + B$$

(where A and B are coefficients dependent on the substrate and resist), and the pattern dimension gap ΔW which is created at the boundary between the gradation numbers k and k+1, is expressed by:

$$\Delta W = (M_k - M_{k+1}) \times (A \times \rho + B) \times D_0.$$

In the case of these relationships, it is preferable that the separation of gradation and the representative correction amount should be set such that ΔW becomes substantially constant regardless of ρ.

Next, the first embodiment of the present invention will now be described in more detail.

Figure 3:
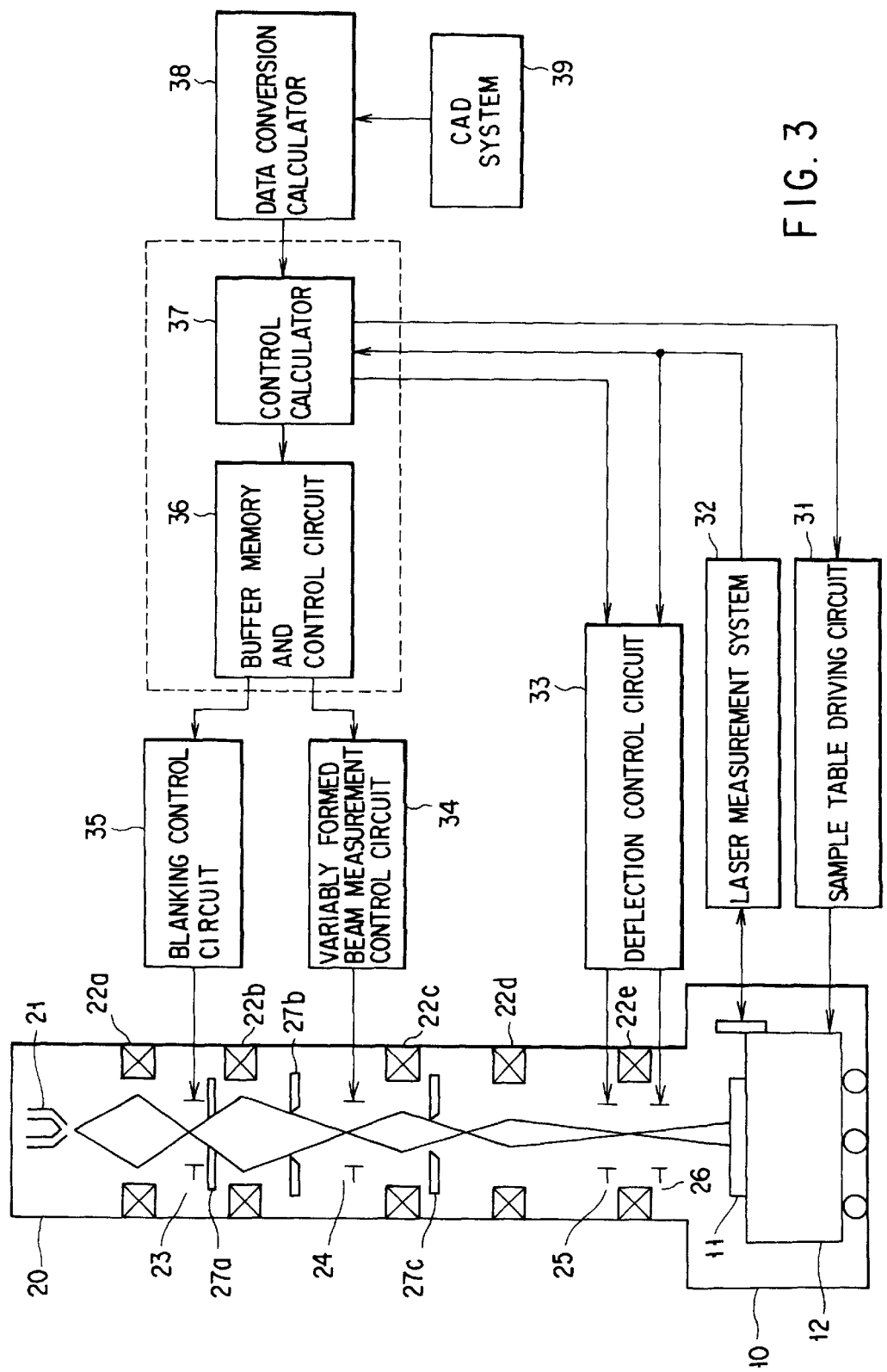
FIG. 3 is a diagram schematically showing the structure of the electron beam pattern drawing device according to an embodiment of the present invention.

FIG. 3 is a diagram schematically showing the structure of an electron beam pattern drawing device used in the first embodiment of the present invention.

A sample 11 is placed on a sample table 12 in a sample chamber 10. In an electronic optical tube 20, an electron gun 21, various lens systems 22a to 22e, various deflecting systems 23 to 26, a blanking plate 27a and apertures 27b and 27c for forming beams are provided. This figure also shows a sample table drive circuit unit 31, a laser measuring system 32, a deflection control circuit unit 33, a variably formed beam dimension control circuit unit 34, a blanking control circuit 35, a buffer memory and control circuit 36, a control calculator 37, a data conversion calculator 38 and a CAD system 39.

An electron beam emitted from the electron gun 21 is blocked or allowed to pass the blanking deflecting mechanism 23. During this period, as the irradiation time is adjusted, it is made possible to change the irradiation amount in accordance with the location of the irradiation.

The electron beam having passed the blanking plate 27a is formed into a rectangular shape by the beam formation deflector 24 and the beam forming apertures 27b and 27c, and the dimension of the rectangular shape is changed. Further, thus formed beam is deflection-scanned on the sample 11 by the scanning deflectors 25 and 26, and with the beam scanning, a desired pattern is drawn on the sample 11. It should be noted that the standard acceleration voltage is 50 kV, and the maximum size of the variably formed beam which can be created, is a rectangular having a 2 μm square.

A pattern designed by the CAD system 39 is converted into drawing data by the data conversion calculator 38. The drawing data consists mainly of two data items. One is the data which describes the size and position of the beam formed, and the other is the irradiation amount data expressed by indicating an increment (correction amount) with respect to the reference irradiation amount, obtained by the calculation of the proximity effect correction, in 256 gradations.

The reference irradiation amount in this case is the optimal irradiation amount in the case where the drawing area ratio is approximately 100%.

FIG. 1, described above, shows the relationship between the drawing area ratio and the variance of line width, caused by the variance of the irradiation amount by 1 $\mu C/cm^2$, in the case where ZEP7000 of NIHON ZEONE CO. was used as the resist.

When the drawing area ratio was close to 0%, the variance of the line width was 10 nm/($\mu C/cm^2$), whereas when the drawing area ratio was close to 100%, the variance of the line width was 23 nm/($\mu C/cm^2$). The back scattering coefficient η obtained was 0.8.

In general, the relationship between the back scattering coefficient η and the optimal irradiation amount D (ρ) for the drawing area ratio ρ can be expressed as an approximation:

$$D(\rho)=D0(1+2\eta)/(1+2\eta\rho) \quad (1)$$

where D0 represents the optimal irradiation amount obtained when the drawing area ratio is close to 100%, and is assigned as the reference irradiation amount. As the drawing area ratio is lower, the correction amount for the irradiation amount becomes larger. Further, the range of the correction amount is 100 to 260% of the reference irradiation amount when the bask scattering coefficient η is 0.8.

By contrast, as can be seen from FIG. 1, as the drawing area ratio is lower, the amount of variance of line width becomes smaller. That is, as the correction amount for the irradiation amount is larger, the amount of variance of the line width per unit irradiation amount variation becomes smaller.

On the basis of the formula (1) and the relationship shown in FIG. 1, the correction amount obtained from the calculation of the proximity effect correction is separated in 256 gradations such as to make the gap uniform. More specifically, the width of the separation is made finer as the correction amount is smaller (the drawing area ratio is higher), whereas the width of the separation is increased as the correction amount becomes larger (the drawing area ratio is lower).

Here, the relationship between the optimal irradiation amount $D_k$ which is obtained from the representative correction amount $M_k$ corresponding to the gradation number k, and the reference irradiation amount $D_0$ is assigned as:

$$D_k=M_k \times D_0 \quad (2)$$

Further, the variance dw of the line width of a pattern per a unit irradiation amount dD is expressed in the form of a linear expression (first order formula) of the drawing area ratio ρ, that is, $$dw/dD=A \times \rho + B \quad (3)$$

(where A and B are coefficients dependent on the substrate and resist), and the pattern dimension gap ΔW which is created at the boundary between the gradation numbers k and k+1, is expressed by:

$$\Delta W=(M_k-M_{k+1}) \times (A \times \rho + B) \times D0 \quad (4)$$

In the case of these relationships, the separation of gradation and the representative correction amount are set such that ΔW becomes substantially constant regardless of ρ. In this manner, the step gaps of the line width, which are created at the boundaries between gradations separated in 256, become uniform, and thus it becomes possible to obtain a uniform gap for all the drawing area ratios.

Figure 4:
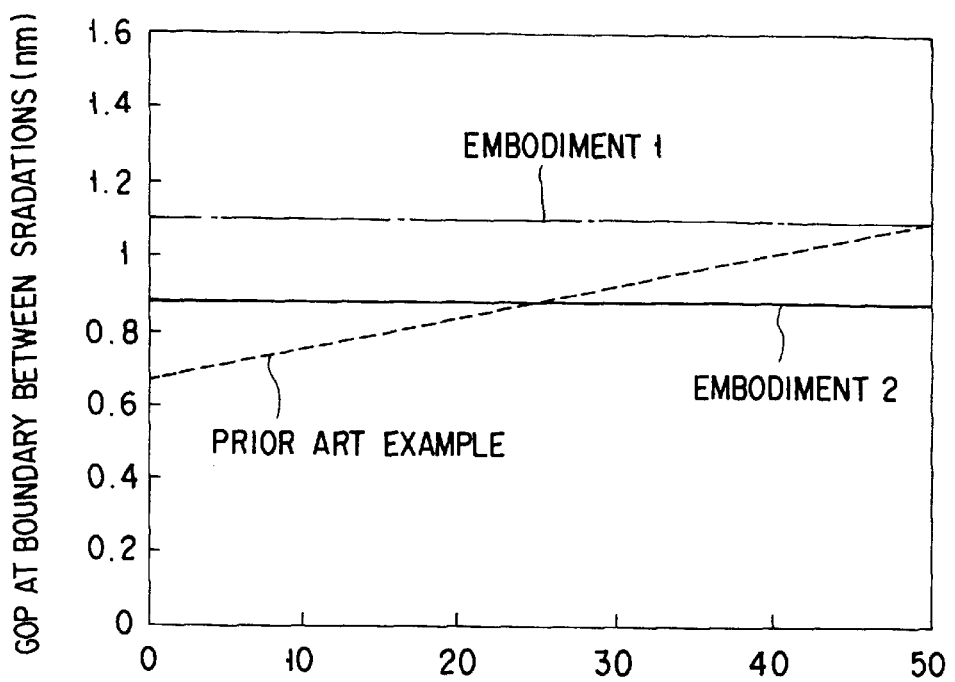
FIG. 4 is a diagram showing the relationship between the drawing area ratio and the gap resulting at the boundary between gradations, obtained in the first embodiment of the electron beam drawing method according to the present invention, as compared with that of a prior art technique.

FIG. 4 is a diagram showing the relationship between the drawing area ratio and the gap of the line width resulting at the boundaries between gradations of a pattern drawn by using the drawing data separated in 256 gradations by the electron beam drawing method according to the present invention, as compared with that of a prior art technique.

The sample subjected to the evaluation was a substrate used for a photomask, and was prepared by applying a Cr film having a thickness of 0.1 μm on a quartz substrate having a size of 6 inch square and thickness of 0.25 inches, and further applying thereon a 0.5 μm-thick resist of ZEP7000. For the development, ZED-500 of NIHON ZEONE Co. was employed, and the development was carried out for 480 seconds using a spray-type developing device.

As can be understood from FIG. 4, in the case of the conventional technique, the gap is small in the region where the drawing area ratio is low; however as the area ratio increases, the gap becomes larger, and when the drawing area ratio is close to 100%, a gap of as large-as 1.6 nm is created. By contrast, in the case of the method according to the embodiment of the present invention, the gap is constantly 1 nm regardless of the drawing area ratio.

Thus, it becomes possible to carry out the proximity effect correction at high accuracy while maintaining a constant gap regardless of the drawing area ratio.

The second embodiment of the present invention will now be described.

In this embodiment, the electron beam pattern drawing device shown in FIG. 3 is used as in the first embodiment. Further, as the resist, ZEP7000 of NIHON ZEONE Co. is employed as in the first embodiment. Therefore, the relationship between the drawing area ratio and the variance of line width, caused by the variance of the irradiation amount by 1 $\mu C/cm^2$, is as shown in FIG. 1. Thus, when the drawing area ratio was close to 0%, the variance of the line width was 10 nm/($\mu C/cm^2$), whereas when the drawing area ratio was close to 100%, the variance of the line width was 23 nm/($\mu C/cm^2$). The back scattering coefficient η obtained was 0.8 as in the first embodiment.

In the first embodiment described above, the range of the drawing area ratio from 0% to 100% is separated in 256 gradations. However, the range of the drawing area ratio of many of the actual semiconductor device patterns, is, for example, 0 to 40%, 60 to 100% or 20 to 80%, and a few patterns really require the range of the drawing area ratio from 0% to 100%. Therefore, as an actual sense, the separation of gradation is conducted as described below in this embodiment.

That is, the maximum drawing area ratio and the minimum drawing area ratio of a pattern to be drawn are obtained in advance, and the maximum drawing area ratio ($\rho_{max}$) and the minimum drawing area ratio ($\rho_{min}$) are determined so that these values are included. In the case of this embodiment, the drawing area ratio of a pattern used was 0% to 41%, and therefore $\rho_{min}$ was 0% and $\rho_{max}$ was 100%. Therefore, it suffices if the correction amount which occurs from 0% to 50% of the drawing area ratio is separated into 256 gradations. Thus, it becomes possible to separate the amount more finely than the case of the drawing area ratio ranging from 0% to 100%, and thus the dimension gap created at a boundary between gradations can be made smaller.

More specifically, as described in the first embodiment, the correction amount obtained from the calculation of the proximity effect correction (that is, the correction amount for the drawing area ratio ranging from 0% to 50%) is separated in 256 gradations such as to made the gap uniform, on the basis of the formula (1) and the relationship illustrated in FIG. 1. Further, the separation of gradation and the representative correction amount are set such that $\Delta W$ becomes substantially constant regardless of $\rho$ on the basis of the formulas (2) to (4) as in the first embodiment. In this manner, the step gaps of the line width, which are created at the boundaries between gradations separated in 256, become uniform, and thus it becomes possible to obtain a uniform gap for all the drawing area ratios ranging from 0% to 50%.

Figure 5:
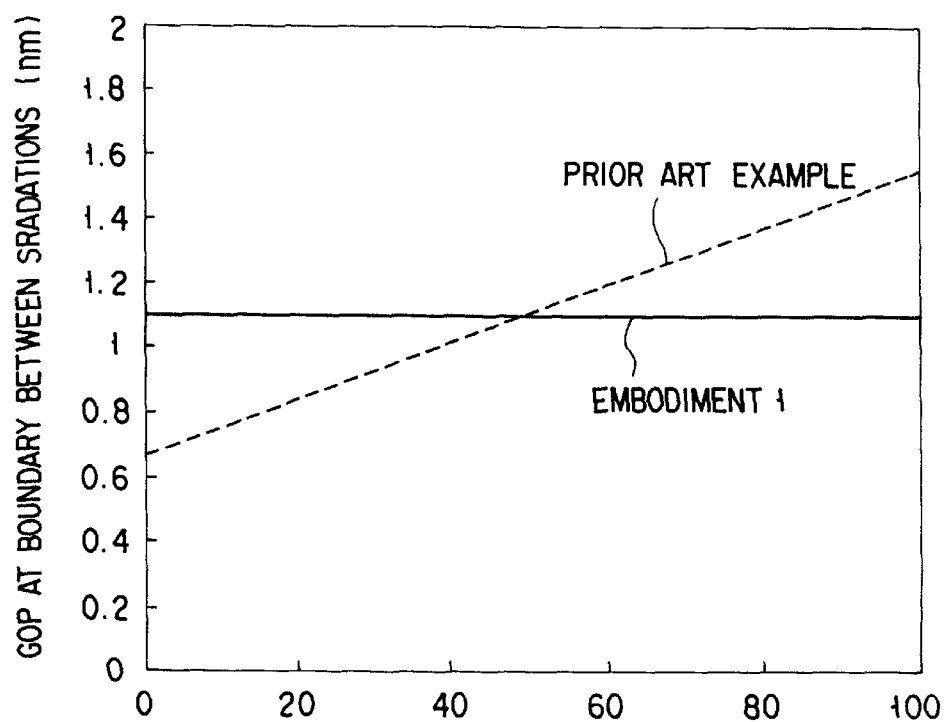
FIG. 5 is a diagram showing the relationship between the drawing area ratio and the gap resulting at the boundary between gradations, obtained in each of the first and second embodiments of the electron beam drawing method according to the present invention, as compared with that of the prior art technique.

FIG. 5 is a diagram showing the relationship between the drawing area ratio and the gap of the line width resulting at the boundaries between gradations of a pattern drawn by using the drawing data whose drawing area ratio ranging from 0% to 50% is separated in 256 gradations in the electron beam drawing method according to the present invention, as compared with the results obtained in the first embodiment and the prior art technique.

The sample subjected to the evaluation was a substrate used for a photomask, and was prepared by applying a Cr film having a thickness of 0.1 $\mu$m on a quartz substrate having a size of 6 inch square and thickness of 0.25 inches, and further applying thereon a 0.5 $\mu$m-thick resist of ZEP7000. For the development, ZED-500 of NIHON ZEONE Co. was employed, and the development was carried out for 480 seconds using a spray-type developing device.

As can be seen from FIG. 5, with the method according to this embodiment, the proximity effect correction accuracy which is regardless of the drawing area ratio can be obtained can be obtained as in the first embodiment, and further even a more highly accurate correction than that presented in the first embodiment can be performed.

It should be noted that in both of the first and second embodiments, it is possible to employ a proximity formula which is more strict than the formula (1). Further, since the relationship between the drawing area ratio and the variance of line width, caused by the variance of irradiation by 1 $\mu$C/cm$^2$ varies depending upon the type of the resist, the process, the type of the substrate, the type of the drawing device, and so on, the separation mode differs from one case to another. Furthermore, the number of gradations is not limited to 256, but it may be larger or smaller.

Lastly, the present invention can be remodeled into various versions as long as the essence of the invention remains within its range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam drawing method comprising the steps of:
   obtaining an optimal irradiation amount of an electron beam in accordance with a drawing area ratio at each of drawing positions, prior to drawing a pattern by irradiating an electron beam on a sample;
   separating said optimal irradiation amount obtained in a plurality of gradations as a correction amount for a reference irradiation amount of the electron beam, said separation being made finer as the drawing area ratio being higher, and determining a representative correction amount data for each of said plurality of gradations;
   storing said representative correction amount data determined for each of said plurality of gradations; and
   drawing a pattern on a sample with the optimal irradiation amount corresponding to read data of said representative correction amount stored.

2. An electron beam drawing method according to claim 1, wherein said separating of gradation and said representative correction amount are set such that $\Delta W$ becomes substantially constant regardless of $\rho$, when the relationship between the optimal irradiation amount $D_k$ and the reference irradiation amount $D_0$ is assigned as:

$$D_k = M_k \times D_0$$

where k represents the gradation number of a gradation, $M_k$ represents the representative correction amount corresponding to the gradation number, $D_k$ represents the optical irradiation amount obtained from the representative correction amount $M_k$,
   a variance dw of the line width of a pattern per a unit irradiation amount dD is expressed in the form of a first order formula of the drawing area ratio $\rho$, that is, $$dw/dD = A \times \rho + B$$

where A and B are coefficients dependent on the substrate and resist,
   and the pattern dimension gap $\Delta W$ which is created at the boundary between the gradation numbers k and k+1, is expressed by:

$$\Delta W = (M_k - M_{k+1}) \times (A \times \rho + B) \times D0.$$

3. An electron beam drawing method comprising the steps of:
   obtaining an optimal irradiation amount of an electron beam in accordance with a drawing area ratio at each of drawing positions, prior to drawing a desired pattern by irradiating an electron beam on a sample;
   separating said optimal irradiation amount obtained in a plurality of gradations as a correction amount for a reference irradiation amount of the electron beam, said separation being made in a plurality of gradations between a maximum value of said correction amount and a minimum value of said correction amount, and determining a representative correction amount data for each of said plurality of gradations;
   storing said representative correction amount data determined for each of said plurality of gradations; and drawing a pattern on a sample with the optical irradiation amount corresponding to read data of said representative correction amount stored.

4. An electron beam drawing method according to claim 3, wherein said separation in a plurality of gradations is made finer as the drawing area ratio is higher.

5. An electron beam drawing method according to claim 4, wherein said separating of gradation and said representative correction amount are set such that $\Delta W$ becomes substantially constant regardless of $\rho$, when the relationship between the optimal irradiation amount $D_k$ and the reference irradiation amount $D_0$ is assigned as:

$$D_k = M_k \times D_0$$

where k represents the gradation number of a gradation, $M_k$ represents the representative correction amount corresponding to the gradation number, $D_k$ represents the optical irradiation amount obtained from the representative correction amount $M_k$, a variance dw of the line width of a pattern per a unit irradiation amount dD is expressed in the form of a first order formula of the drawing area ratio $\rho$, that is, $$dw/dD = A \times \rho + B$$

where A and B are coefficients dependent on the substrate and resist, and the pattern dimension gap $\Delta W$ which is created at the boundary between the gradation numbers k and k+1, is expressed by:

$$\Delta W = (M_k - M_{k+1}) \times (A \times \rho + B) \times D0.$$

6. An electron beam drawing method according to claim 4, wherein said separating of gradation and said representative correction amount are set such that $\Delta W$ becomes substantially constant regardless of $\rho$, when the relationship between the optimal irradiation amount $D_k$ and the reference irradiation amount $D_0$ is assigned as:

$$D_k = M_k \times D_0$$

where k represents the gradation number of a gradation, $M_k$ represents the representative correction amount corresponding to the gradation number, $D_k$ represents the optical irradiation amount obtained from the representative correction amount $M_k$, the variance dw of the line width of a pattern per a unit irradiation amount dD is expressed in the form of a first order formula of the drawing area ratio $\rho$, that is, $$dw/dD = A \times \rho + B$$

where A and B are coefficients dependent on the substrate and resist, and the pattern dimension gap $\Delta W$ which is created at the boundary between the gradation numbers k and k+1, is expressed by:

$$\Delta W = (M_k - M_{k+1}) \times (A \times \rho + B) \times D0.$$

7. An electron beam drawing device comprising:

means for obtaining an optimal irradiation amount of an electron beam in accordance with a drawing area ratio at each of drawing positions, prior to drawing a desired pattern by irradiating an electron beam on a sample;

means for separating said optimal irradiation amount obtained in a plurality of gradations as a correction amount for a reference irradiation amount of the electron beam, said separation being made finer as the drawing area ratio is higher, and determining a representative correction amount data for each of said plurality of gradations;

means for storing said representative correction amount data determined for each of said plurality of gradations; and means for drawing a pattern on a sample with the optical irradiation amount corresponding to read data of said representative correction amount stored.

8. An electron beam drawing device according to claim 7, wherein said separating means separates the correction amount in gradations and determines said representative correction amount, such that $\Delta W$ becomes substantially constant regardless of $\rho$, when the relationship between the optimal irradiation amount $D_k$ and the reference irradiation amount $D_0$ is assigned as:

$$D_k = M_k \times D_0$$

where k represents the gradation number of a gradation, $M_k$ represents the representative correction amount corresponding to the gradation number, $D_k$ represents the optical irradiation amount obtained from the representative correction amount $M_k$, a variance dw of the line width of a pattern per a unit irradiation amount dD is expressed in the form of a first order formula of the drawing area ratio $\rho$, that is, $$dw/dD = A \times \rho + B$$

where A and B are coefficients dependent on the substrate and resist, and the pattern dimension gap $\Delta W$ which is created at the boundary between the gradation numbers k and k+1, is expressed by:

$$\Delta W = (M_k - M_{k+1}) \times (A \times \rho + B) \times D0.$$

9. An electron beam drawing device comprising:

means for obtaining an optimal irradiation amount of an electron beam in accordance with a drawing area ratio at each of drawing positions, prior to drawing a desired pattern by irradiating an electron beam on a sample;

means for separating said optimal irradiation amount obtained in a plurality of gradations as a correction amount for a reference irradiation amount of the electron beam, said separation being made in a plurality of gradations between a maximum value of said correction amount and a minimum value of said correction amount, and determining a representative correction amount data for each of said plurality of gradations;

means for storing said representative correction amount data determined for each of said plurality of gradations; and means for drawing a pattern on a sample with the optical irradiation amount corresponding to read data of said representative correction amount stored.

10. An electron beam drawing device according to claim 9, wherein said separating means for separating the correction amount in plurality of gradations, separates the correction amount finer as the drawing area ratio is higher.

11. An electron beam drawing device according to claim 10, wherein said separating means separates the correction amount in gradations and determines said representative correction amount, such that ΔW becomes substantially constant regardless of $\rho$, when the relationship between the optimal irradiation amount $D_k$ and the reference irradiation amount $D_0$ is assigned as:

$$D_k = M_k \times D_0$$

where k represents the gradation number of a gradation, $M_k$ represents the representative correction amount corresponding to the gradation number, $D_k$ represents the optical irradiation amount obtained from the representative correction amount $M_k$, the variance dw of the line width of a pattern per a unit irradiation amount dD is expressed in the form of a first order formula of the drawing area ratio $\rho$, that is, $$dw/dD = A \times \rho + B$$

where A and B are coefficients dependent on the substrate and resist, and the pattern dimension gap ΔW which is created at the boundary between the gradation numbers k and k+1, is expressed by:

$$\Delta W = (M_k - M_{k+1}) \times (A \times \rho + B) \times D0.$$

12. An electron beam drawing device according to claim 10, wherein said separating means separates the correction amount in gradations and determines said representative correction amount, such that ΔW becomes substantially constant regardless of $\rho$, when the relationship between the optimal irradiation amount $D_k$ and the reference irradiation amount $D_0$ is assigned as:

$$D_k = M_k \times D_0$$

where k represents the gradation number of a gradation, $M_k$ represents the representative correction amount corresponding to the gradation number, $D_k$ represents the optical irradiation amount obtained from the representative correction amount $M_k$, the variance dw of the line width of a pattern per a unit irradiation amount dD is expressed in the form of a first order formula of the drawing area ratio $\rho$, that is, $$dw/dD = A \times \rho + B$$

where A and B are coefficients dependent on the substrate and resist, and the pattern dimension gap ΔW which is created at the boundary between the gradation numbers k and k+1, is expressed by:

$$\Delta W = (M_k - M_{k+1}) \times (A \times \rho + B) \times D0.$$

* * * * *